(12) United States Patent
Temkin et al.

(10) Patent No.: US 6,391,748 B1
(45) Date of Patent: May 21, 2002

(54) METHOD OF EPITAXIAL GROWTH OF HIGH QUALITY NITRIDE LAYERS ON SILICON SUBSTRATES

(75) Inventors: Henryk Temkin, Ransom Canyon; Sergey A. Nikishin, Lubbock, both of TX (US)

(73) Assignee: Texas Tech University, Lubbock, TX (US)

( * ) Notice: Subject to any disclaimer, the term of this patent is extended or adjusted under 35 U.S.C. 154(b) by 0 days.

(21) Appl. No.: 09/677,762

(22) Filed: Oct. 3, 2000

(51) Int. Cl.[7] .............................................. H01L 21/20
(52) U.S. Cl. ........................ 438/478; 438/483; 438/493
(58) Field of Search ................................. 438/478, 479, 438/483, 503, 507, 492, 493, 758; 117/84, 89, 92, 108, 952; 257/103; 427/248.1, 255.23, 255.34, 255.394; 148/33.4

(56) References Cited

U.S. PATENT DOCUMENTS

| | | | |
|---|---|---|---|
| 4,596,626 A | | 6/1986 | Schlichta |
| 4,861,417 A | | 8/1989 | Mochizuki |
| 4,977,103 A | | 12/1990 | Chand |
| 5,013,685 A | | 5/1991 | Chiu |
| 5,262,361 A | | 11/1993 | Cho |
| 5,389,571 A | * | 2/1995 | Takeuchi et al. |
| 5,476,811 A | | 12/1995 | Fujii |
| 5,733,796 A | | 3/1998 | Manabe |
| 5,831,277 A | * | 11/1998 | Razeghi ........................ 257/15 |
| 6,045,626 A | * | 4/2000 | Yano et al. .................. 148/33.4 |
| 6,064,078 A | * | 5/2000 | Northrup et al. ............. 257/96 |
| 6,146,457 A | * | 11/2000 | Solomon ....................... 117/90 |
| 6,146,458 A | * | 11/2000 | Hooper et al. ............... 117/106 |
| 6,176,925 B1 | * | 1/2001 | Solomon et al. ............. 117/89 |
| 6,291,318 B1 | * | 9/2001 | Webb et al. ................. 438/478 |

\* cited by examiner

Primary Examiner—Savitri Mulpuri
(74) Attorney, Agent, or Firm—Jones, Tullar & Cooper, P.C.

(57) ABSTRACT

Aluminum nitride, AlN, layers are grown on silicon substrates using molecular beam epitaxial (MBE) growth. The AlN layer is initially grown by subjecting the silicon substrate to background ammonia followed by repetitively alternating the flux of 1) Al without ammonia and 2) ammonia without Al. After the surface of the silicon structure is sufficiently covered with AlN, the wafer is further subjected to a flux of ammonia and aluminum applied simultaneously to continue the epitaxial growth process. The process minimizes the formation of amorphous silicon nitride, $SiN_x$, compounds on the surface of the substrate which form due to background nitrogen levels in the molecular beam epitaxial growth apparatus. A surface free of amorphous silicon nitride is necessary for formation of high quality AlN. The AlN layer may be further used as a buffer layer for AlGaN/GaN growth. After the AlN layer is grown on the silicon structure, the silicon structure may be subjected to a flux of Ga and nitrogen to form a layer of GaN.

17 Claims, 9 Drawing Sheets

METHOD OF EPITAXIAL GROWTH OF HIGH QUALITY NITRIDE LAYERS ON SILICON SUBSTRATES

This invention was made with Government support under Grant No. F19628-99-C-0013, awarded by Defense Advanced Research Project Agency (DARPA). The Government has certain rights in the invention.

BACKGROUND OF THE INVENTION

The present invention relates, in general, to epitaxial growth on silicon, and more particularly to the growth of ordered nitride layers on silicon substrates.

There is a growing recognition of the benefits of producing nitride layers such as AlGaN or GaN structures on silicon substrates, instead of substrates such as sapphire, since silicon is inexpensive and readily available, has a higher thermal conductivity than sapphire, and is electrically conductive. Further, silicon substrates could be used in the production of conventional electronic devices and GaN-based devices side-by-side on a single wafer; however, reliable techniques for epitaxial growth of nitride on silicon have not been available. The growth of nitride layers on sapphire has been the subject of detailed investigation, but the details of epitaxial growth of nitride on silicon structures have not been fully investigated. One reason for this is that growth nucleation and formation of appropriate buffer layers on silicon structures have appeared to be difficult. Several approaches, including the use of intermediate layers, have been proposed to resolve the problems associated with epitaxial growth on silicon substrates, but none have been entirely satisfactory.

It is well understood that the problem of epitaxially growing nitride layers on silicon substrates arises from the uncontrolled formation of amorphous $SiN_x$ on the silicon surface. This occurs, for example, when a gaseous nitrogen source is used during molecular beam epitaxial growth on a silicon substrate, for once the epitaxial chamber is exposed to nitrogen, or nitrogen containing gases or compounds, a nitrogen background is then present in the growth apparatus in subsequent growth experiments. In the case of a silicon substrate, such a nitrogen background results in the formation of a thin amorphous layer of $SiN_x$ at the surface of the silicon, once the wafer is heated to the growth temperature. The layer of $SiN_x$, which is at most a few monolayers thick, forms spontaneously and is therefore difficult to control. This layer typically is not uniform, and the surface coverage it provides is typically in the form of islands. The average thickness of this layer depends on the background pressure of nitrogen, the temperature of the substrate, the exposure time, and details of the silicon surface structure. Even in a very clean system, i.e. with a low nitrogen background, formation of the Si—N bonds cannot be prevented.

One known approach to solving the problem of $SiN_x$ island formation is the use of low temperature nucleation, but this is at the cost of poor layer quality. The low quality of this nucleation layer can be improved by subsequent high temperature anneals, but no quantitative information exists as to the degree of recovery that can be obtained with this procedure. In addition, low temperature nucleation results in uncontrolled domain structure. Epitaxial layers of AlN and GaN grown on such nucleation layers are characterized by polarization domains at the surface, and this restricts the use of this material in device applications. In principle, a solution to this problem exists, for experience with the growth of GaAs on Si (001) shows that the propagation of one type of domains can be largely inhibited. While this approach has been successful in the growth of GaAs on Si(001) its use in the growth of GaN on silicon remains to be demonstrated.

A method of low temperature nucleation of AlN on Si(111) involving surface nitridation has been described by Kipshidze et al., Semiconductors 33(11), 1241 (1999). In this approach, the surface of Si was exposed at a low temperature to the nitrogen flux derived from a plasma source. MBE experiments on the growth of AlN on Si(111), carried out with plasma sources of active nitrogen, showed that growth could be initiated at temperatures lower than $T_t$=1100 K. Two dimensional (2D) growth appears more likely at low growth temperatures, where island nucleation density, rather than the adatom surface mobility, is optimized. However, this method does not produce high quality material.

A second approach to solving the problem of $SiN_x$ island formation is described in the literature as including the formation of a stable Al—Si phase, known as the γ-phase [Yasutake et al., J. Vac. Sci. Technol. A16(4), 2140 (1998)]. The γ-phase corresponds to the Al coverage of 1/3 ML (monolayer) where each atom of Al saturates three dangling bonds of Si. The detailed structure of this phase is not known. In the γ-phase, the atoms of Al are believed to saturate the surface bonds of Si and thus prevent nitridation. However, in the formation of AlN through the γ-phase, about 34% of the substrate surface area remains exposed to the nitrogen flux, with the resulting formation of Si—N bonds or amorphous $SiN_x$. The resulting AlN will thus have at least two types of domains, one formed over Si-Al regions, the other on Si—N regions, and accordingly this method is not satisfactory.

BRIEF SUMMARY OF THE INVENTION

The present invention overcomes the problems described above by providing a unique process for growing AlN and other nitrides on silicon. Briefly, the preferred embodiment of the invention includes first exposing a silicon wafer to a background flux of nitrogen, preferably in the form of ammonia, by placing the wafer in a molecular beam epitaxy (MBE) chamber. This produces a nucleated nitride layer on the silicon substrate thereby forming ordered Si—N bonds at the surface. A nitride-containing nucleation layer, preferably an AlN nucleation layer, is then formed on the surface of the substrate by subjected the wafer to a flux of aluminum using MBE, subjecting the wafer to a flux of nitrogen, also using MBE, and thereafter subjecting the wafer to additional alternate fluxes of aluminum and nitrogen. Finally, AlN is grown on the wafer by subjecting the AlN nucleated layer to a combined flux of aluminum and nitrogen using MBE. In particular, the nitrogen flux may be a gas containing ammonia. A GaN layer may then be grown on the silicon wafer, if desired. In this way, high quality epitaxial layers of nitride-containing compounds, such as AlN or GaN, can be grown on a Si(111) substrate by gas source molecular beam epitaxy (GSMBE) using $NH_3$ as the nitrogen source.

More particularly, in the preferred embodiment of the invention the surface of a silicon substrate, or wafer, is first chemically etched to produce a hydrogen-terminated surface. The ordinary surface of Si, in the air, is covered by native oxides which may not be stoichiometric, i.e. their chemical composition may deviate from that of $SiO_2$, and the presence of such oxides makes epitaxial crystal growth impossible. In the usual practice of molecular beam epitaxy, the native oxides are removed from the substrate surface by a chemical etch process, and once the native oxides are removed, the surface is covered with hydrogen. The resulting hydrogen-terminated surface is stable in the air for tens of minutes, thus providing the time needed to place the substrate in a conventional epitaxial growth apparatus. The sample is then heated to above 920 K, in a vacuum greater than $10^{-8}$ torr, and the hydrogen leaves the surface. The hydrogen-terminated surface does not react with the background nitrogen or ammonia that may be present in the epitaxial chamber, up to a temperature of 920 K.

The second step to the process is to form the nitride nucleation layer, preferably an AlN nucleation layer, by first subjecting the etched substrate to background nitrogen, preferably ammonia, in the MBE growth chamber. The pressure of the background ammonia is maintained, with careful procedures, in the range of preferably $10^{-7}$ to $10^{-9}$ torr. The nucleation and growth temperature of AlN is preferably 1160±30 K, which is dictated by considerations of surface kinetics. Since molecules of ammonia crack at the surface of a semiconductor substrate at temperatures in excess of 920 K, it is not possible to lower the growth temperature of the AlN. Within the typical constraints of the MBE apparatus, the surface of the Si substrate is exposed to ammonia for a few minutes, before the AlN nucleation or growth can be started. Even with the relatively low background pressure of ammonia achieved in the system, formation of Si—N bonds cannot be prevented.

The exposure of the silicon substrate to background nitrogen produces Si—N bonds on the surface of the substrate, resulting in a new 4×4 surface structure, as seen by RHEED images. The period of the Si—N surface structure has an important relationship to the lattice constants of Si and AlN. Four periods of the Si—N related surface structure are almost equal to five periods of AlN. This is, to within 1%, the same relationship as that between Si(111) and AlN(0001). This relationship assures uniform and precisely oriented nucleation of AlN on the substrate of Si(111). In addition, once a layer of AlN is formed, this relationship results in complete relaxation of this layer through formation of misfit dislocations. Since a misfit dislocation starts at every fifth surface atom, dislocations are distributed uniformly on the surface.

In the next step of the process, an AlN nucleation layer is formed on the silicon substrate. MBE growth of AlN with a nitrogen source, preferably ammonia, at a range of growth temperatures of preferably about 1000–1200 K, is carried out. At temperatures below $T_t$ (1100 K), AlN layers with qualities similar to the materials prepared using plasma sources of nitrogen have been obtained. However, it has been found that improved results are obtained when nucleation and growth of the AlN layer are carried out at temperatures above $T_t$, and preferably at temperatures of 1160±30 K. After the silicon substrate reaches the growth temperature, it is subjected to a flux of aluminum, without ammonia and the Al atoms react with the surface nitrogen of the substrate. Reactions between nitrogen, aluminum, and silicon result in formation of a Si—N—Al phase. Next, the aluminum flux is turned off and the substrate is subjected to a flux of ammonia. The silicon substrate is further subjected to an alternating process of aluminum flux only, followed by ammonia flux only. This repetitive process is continued until a flat surface is produced with full coverage of AlN. Once a flat structure of AlN is observed, AlN is grown on the substrate by subjecting the substrate to a combined flux of aluminum and ammonia.

The AlN layer which is formed using the foregoing gas source MBE provides a buffer layer which is needed for the further growth of GaN. High growth temperatures combined with controlled deposition of an AlN layer at the onset of epitaxy results in a very rapid transition to 2-D growth mode of AlN. Because of the formation of amorphous $SiN_x$, at the surface of silicon, high quality epitaxial growth of GaN on Si had been quite difficult, as discussed above, for previously it was found that cracking could occur during the cool-down cycle due to the thermal expansion differences between GaN and silicon. However, because of the suppression of the formation of $SiN_x$ islands on the substrate in accordance with the present invention, and the assured uniform nucleation of a completely relaxed AlN layer at the Si—AlN interface, cracking of the GaN layer is eliminated. Triple crystal X-ray diffraction, transmission electron microscopy (TEM), Raman spectroscopy (RS) and photoluminescence (PL) have been used to show that the resulting nitride-silicon structures are similar to the best samples reported on sapphire.

BRIEF DESCRIPTION OF DRAWINGS

The foregoing, and additional objects, features and advantages of the present invention will become apparent to those of skill in the art from the following detailed description of preferred embodiments thereof, taken in conjunction with the accompanying drawings, in which:

FIG. 4a illustrates a surface partially nitrided with background ammonia;

FIG. 4b illustrates a (1×1) surface of the first monolayer of AlN on Si (111) arising after 6–19 seconds of Al deposition;

FIG. 4c. illustrates the formation of 3D AlN orientation islands during the first 10–30 s of growth;

FIG. 4d. illustrates 2D growth of AlN/Si, with the corresponding streaky pattern, wherein the position of the (00), (01) and (–01) reflections from the (1×1) Si surface are indicated by arrows from left to right, and wherein the extra-reflections arise from nitridation with background $NH_3$;

DETAILED DESCRIPTION

The present invention is directed to an improved process for producing nitride layers on silicon substrates, in which a silicon substrate is first exposed to background nitrogen, preferably in the form of ammonia, yielding ordered Si—N bonds on the surface of the substrate. The process, which includes subjecting the substrate alternately to fluxes of aluminum and nitrogen, minimizes the formation of amorphous $SiN_x$ islands, which have been a major source of problems in the prior art, allowing preparation of a high quality product.

Figure 1:
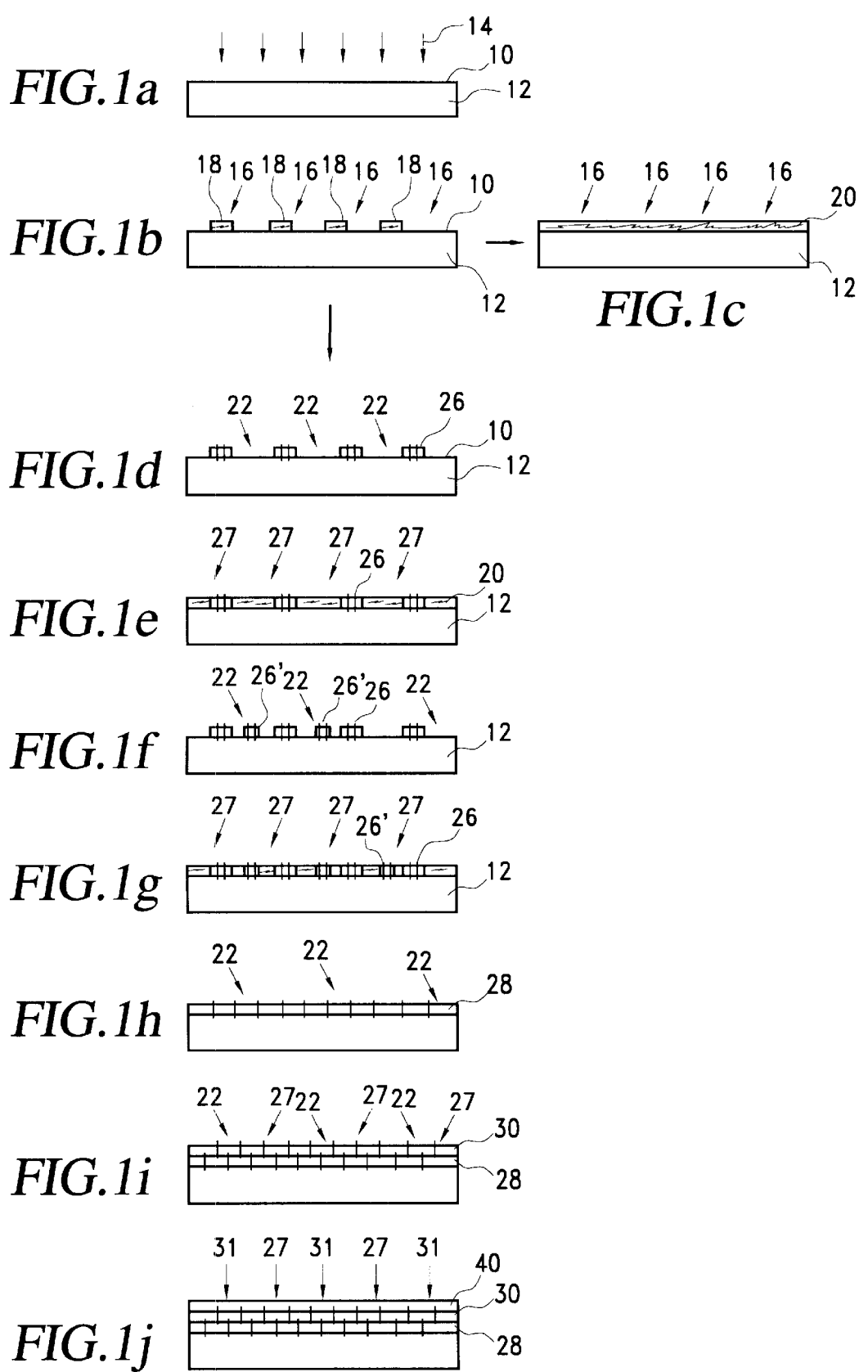
FIGS. 1a–1j illustrate the process of AlN and GaN layer molecular beam epitaxial growth on a silicon substrate in accordance with the present invention.

As illustrated in FIGS. 1a.–1j., to which reference is now made, in the preferred embodiment of the invention epitaxial growth is performed on the top surface 10 of a Si (111) wafer 12. The silicon wafer 12 is first prepared by wet chemical etching, illustrated by arrows 14 in FIG. 1a, the preferred chemical etching process including four main steps: (i) formation of a ~5–6 nm thick $SiO_2$ layer by boiling in $HNO_3$; (ii) creation of a hydrophobic Si surface by etching in a water solution of HF (100:5); (iii) formation of a thin, approximately 0.3–0.5 nm, layer of $SiO_x$ by boiling in $HCl:H_2O:H_2O_2$ (3:1:1) and (iv) formation of a hydrogen saturated surface by etching in HF:ethanol (1:4) solution, resulting in a hydrogen-terminated surface. A wafer 12 prepared by this process is characterized by a (7×7) surface structure, which can be observed by reflection high-energy electron diffraction (RHEED), after heating to 920 K for a few minutes. Formation of this surface structure signifies desorption of hydrogen and formation of a clean silicon surface 10. Upon further increase in temperature, to $T_t$=1100 K, a Si (111) surface reconstruction transition can be observed, from (7×7) to (1×1). This transition provides a convenient temperature calibration point.

Once the clean silicon surface 10 is prepared on wafer 12, a nucleated AlN layer is formed. In order to obtain the best epitaxial layer, the AlN nucleation, as well as the AlN growth, is carried out at a preferred temperature of $T_t$=1160±30 K. The first step in the AlN nucleation process is exposing the Si surface 10 to background ammonia 16 for a few minutes, as illustrated in FIG. 1b. The Si surface 10 is exposed to the background ammonia within the typical constraints of the MBE apparatus upon heating the substrate from 920 K to the nucleation and growth temperature $T_t$. The resulting formation of Si—N bonds 18 can not be prevented and these bonds form as islands, leaving exposed surface areas of clean Si surface 10 between the islands, as illustrated in FIG. 1b. Once the nucleation and growth temperature is reached, at about 1160 K, RHEED images show the formation of a uniform Si—N surface phase 20 with the corresponding appearance of a new (4×4) surface structure, generally illustrated in FIG. 1c.

In order to confirm the formation of such a new (4×4) surface structure, an experiment was conducted wherein the Si wafer 12 was intentionally nitridated with ammonia by allowing the exposure of the background ammonia 16 to continue after the nucleation and growth temperatures had been reached. By allowing the Si wafer 12 to be subjected to a continuing exposure of ammonia 16, an amorphous $SiN_x$ layer started to form, as seen in RHEED images. Although this amorphous $SiN_x$ layer was intentionally grown to confirm the new (4×4) surface structure, the formation of amorphous $SiN_x$ is avoided in the actual epitaxial growth of the AlN surface layer envisioned in this invention because amorphous $SiN_x$ formation yields low quality products. It was found that this intentional nitridation of the Si surface produced a surface layer of Si—N bonds formed on the Si(111) wafer 12, with the bonds having a hexagonal symmetry. This type of bond arrangement is known in bulk crystals of $Si_3N_4$ [Zhai Guang-jie et al. Acta Physica Sinica (China), vol.49, N.2, 215–219 (2000)]. The effective lattice constant at the surface, $a^{4\times4}{}_{surface}$, was almost equal to four lattice constants of Si and five lattice constants of AlN, $a^{0001}{}_{AlN}$. Such a commensurate relationship makes it possible to fit AlN to the Si(111) surface, for the effective lattice mismatch between AlN and Si was greatly reduced from the bulk lattice constant mismatch. Although this experiment shows that uniform nucleation of AlN on Si(111) is possible, the experiment allowed for the undesirable formation of amorphous $SiN_x$.

To take advantage of this new (4×4) surface structure in the nucleation of AlN, a special nucleation procedure is introduced which avoids the formation of amorphous $SiN_x$ in accordance with the present invention. After first exposing the cleaned silicon surface 10 to the background ammonia 16 in the MBE chamber as described above, with respect to FIG. 1b, the second step in the nucleation process requires depositing Al atoms 22 on the Si—N surface phase 20, as shown in FIG. 1d. The interaction between the Al atoms and the Si—N surface phase results in formation of islands 26 of Si—N—Al, also referred to as AlN islands. [Nikishin et al. Materials Research Society Symposium Proceedings, v. 595 "GaN and related Alloys—1999", p. W8.3.1 (2000)]. This is also the initial stage of nucleation formation of AlN on Si since the Si—N—Al phase can be thought of as the interface between Si and AlN. Since Al does not chemically bond with Si, the initial island 26 of AlN must be terminated with Al atoms and this nucleation process results in formation of only one type of domains of AlN. Formation of initial AlN does not provide complete surface coverage because of the large differences in bond strength between Si—N and N—Al resulting in strain and formation of relaxed islands of AlN. The atoms of Al 22 do not react with Al-terminated islands 26 and any additional atoms of Al 22 reaching those islands simply evaporate. The process of island formation also exposes areas of clean silicon surface 10. Since the Al does not form a chemical bond with Si, the Al atoms reaching areas of clean silicon surface 10 evaporate. In this sense the process of Al deposition is self-terminated and the exact duration of exposure to Al or the Al flux is not important.

Step three of the nucleation process is to subject the substrate 12 to an intentional flux 27 of nitrogen, preferably ammonia, without Al, as illustrated FIG. 1e. This step results in formation of ordered Si—N bonds 20, as before, in the areas of clean silicon surface 10 remaining at the surface. Because of the nature of the (0001) plane of hexagonal crystal, known as the b-layer of AlN, there is on bonding between the surface of the AlN islands 26 and the ammonia. Growth of AlN can proceed only when both Al and N are simultaneously present at the surface. After the intentional exposure to a flux of nitrogen 27, the substrate 12 is again exposed to Al atoms 22, without ammonia exposure, as shown in FIG. 1f. This results in the formation of new islands 26' of AlN. These new AlN islands 26' have the same orientation and properties as those formed in the first step of Al atom deposition illustrated in FIG. 1d. Once the new AlN islands 26' are formed, the process is terminated, as above. Repetitive exposure to Al 22 and nitrogen 27 results in increasing surface coverage of AlN islands 26, 26', as illustrated in FIG. 1g. Each cycle covers about ⅔ of the clean silicon surface 10 with AlN. Thus a repeated application of preferably 5–6 cycles assures complete surface coverage of AlN, illustrated as 28 in FIG. 1h. The number of repeats needed depends on the growth temperature, the initial flux of Al, and the nitrogen background in the chamber. RHEED imaging can be used to control this process and to determine the optimum number of repeats.

Once a streaky (1×1) pattern characteristic of AlN is observed, the nucleation layer 28 of AlN is complete and the growth of a layer 30 of AlN can be started by subjecting the silicon substrate 12 to a simultaneous nitrogen flux 27 and Al flux 22, as illustrated in FIG. 1i. In a real growth system this combined flux slightly changes the substrate temperature and the initial fluxes are not stable. Thus, the initial growth is usually in a 3D mode, which results in weak spots formed on the (1×1) RHEED streaks. The 2D growth recovers, as seen by RHEED, after a deposition of 5–7 nm of AlN. The rapid transition to 2D growth is of interest for two reasons. First, it results in a decrease in the defect density, as shown in the TEM cross section of FIG. 2. Second, the rapid transition correlates with the absence of amorphous $SiN_x$ islands required to assure crack-free samples.

Figure 2:
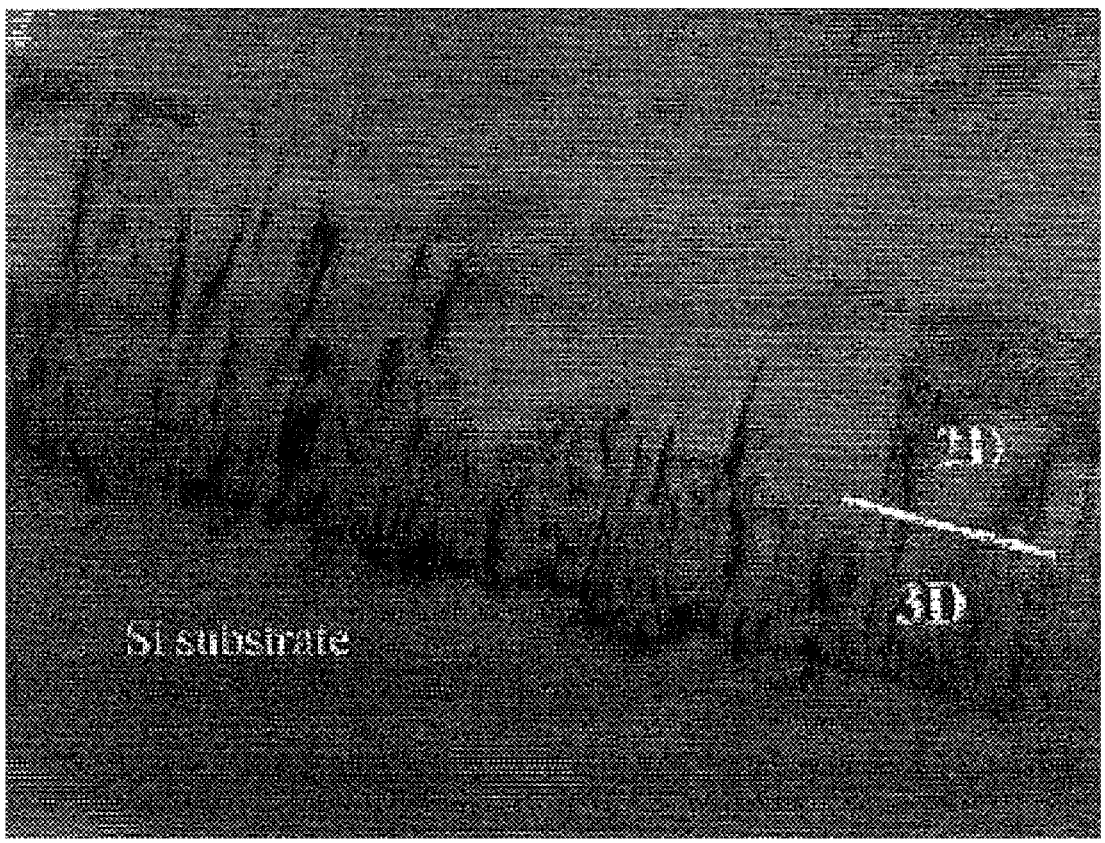
FIG. 2 is a photomicrograph of a (2×2) RHEED pattern related to 2D growth mode of GaN.
Figure 3:
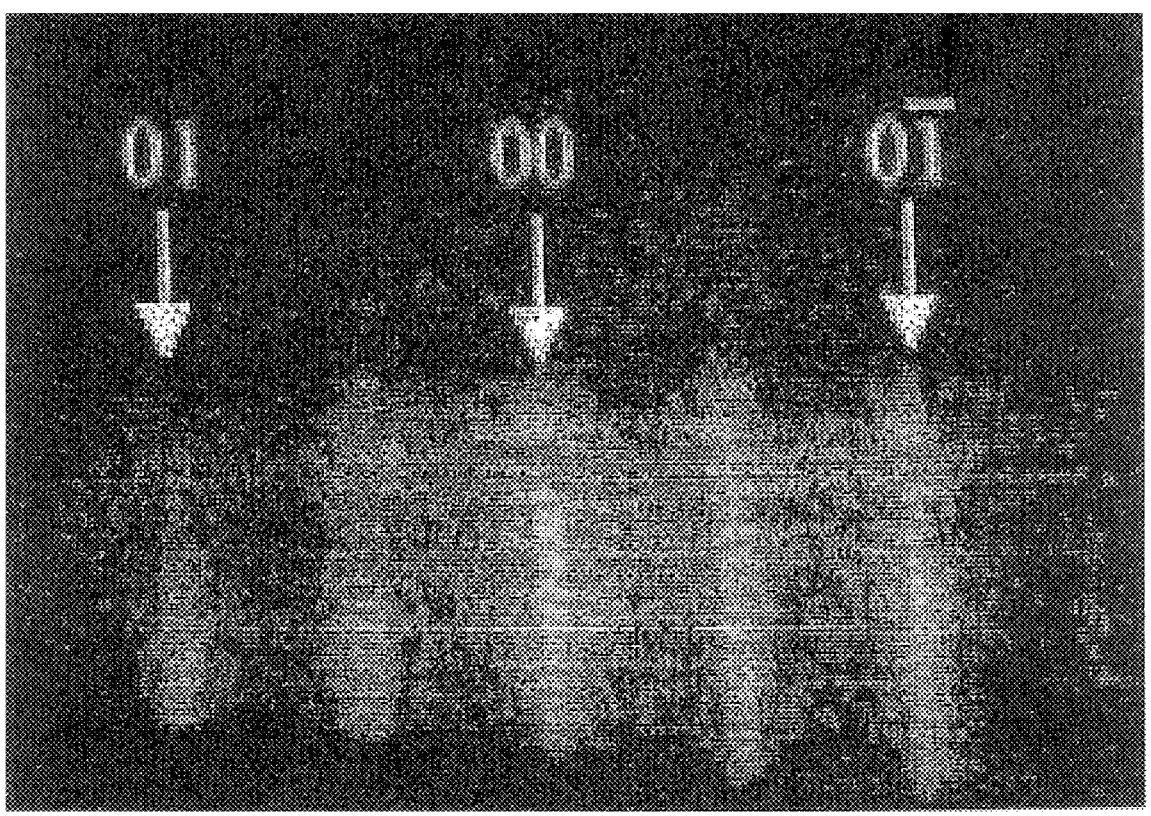
FIG. 3 is a TBM cross-section image of a 130 nm thick AlN buffer layer grown on Si(111)

Optionally, a GaN layer 40 is produced on wafer 12 by subjecting the AlN layer 30 to a combined flux of Ga 31 and nitrogen 27, wherein the nitrogen source is preferably ammonia as illustrated in FIG 1j. The growth of GaN may be started after the transition to 2D growth in the AlN layer 30 has been completed. The AlN layer 30 acts as a buffer layer between the GaN layer 40 and the silicon substrate 12. GaN layers 40 have been grown at a temperature of preferably 1000±30 K, with growth rates of preferably 0.4–1.5 $\mu$m/hr. Formation of a (2×2) surface structure could be seen after deposition of 20–100 nm of GaN, as shown in FIG. 2. Similarly to the growth of the AlN layer, initial growth of GaN is usually in a 3D mode followed by a transition to 2D growth. The fastest 3D-2D transition in GaN was reached at the highest growth rate. Structures incorporating short period AlGaN/GanN superlattices (SLs) were prepared using this process for control of defects propagating from the substrate interface. The effectiveness of such structures is demonstrated in the TEM cross-section of FIG. 3. In addition to the SL placed at the 2D grown AlN layer, experiments were conducted with a second SL placed on GaN, growing in a 2D mode.

Experimental Findings of AlN Layer

Figure 4:
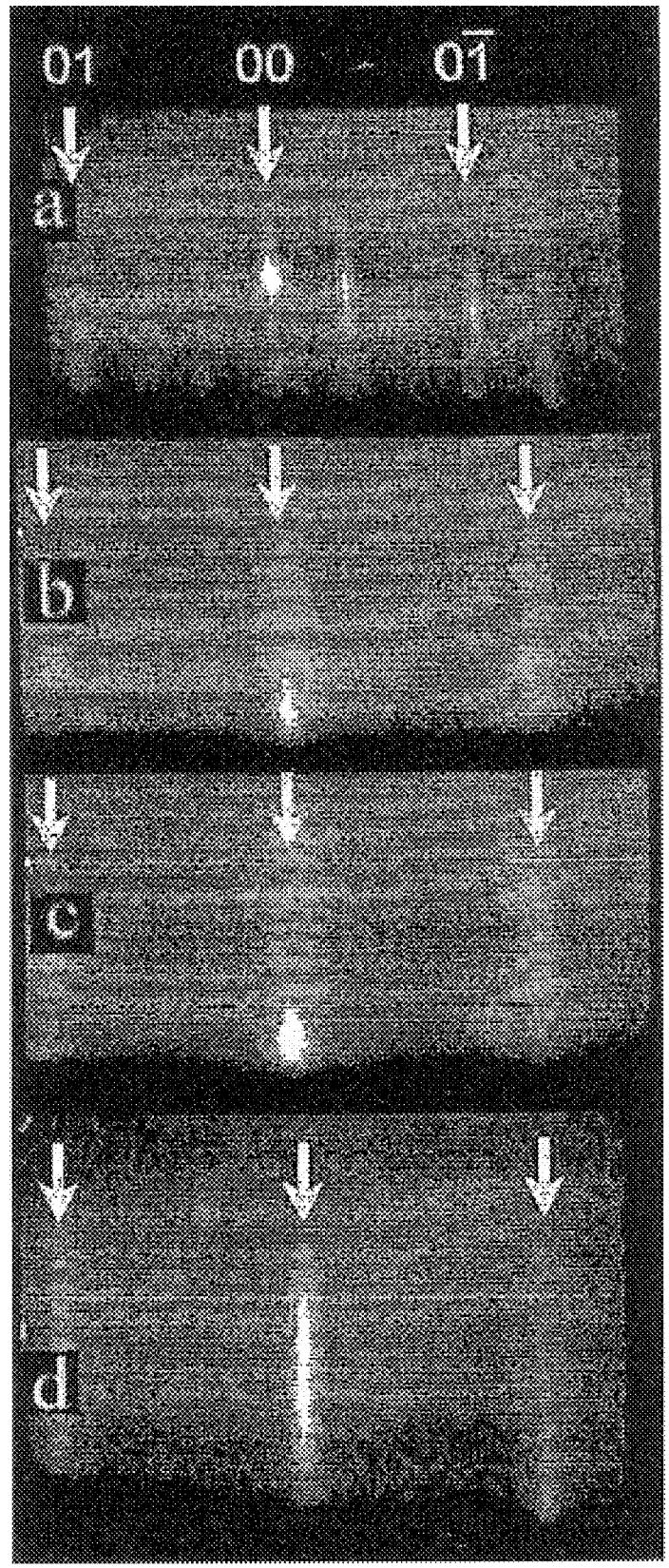
FIGS. 4a–4d are photomicrographs illustrating the evolution of reflection high-energy electron diffraction (RHEED)

The evolution of RHEED patterns illustrating the onset of epitaxy is shown in FIGS. 4a–4d. FIG. 4(a) illustrates the state of the Si surface 10 prior to the deposition of Al. The (4×4) structure results from nitridation of the surface by background ammonia. The position of the (00), (01) and (−01) reflections from the (1×1) Si surface are indicated by arrows. The extra reflections arise from the interaction between background ammonia, with a partial pressure of approximately $10^{-9}$ torr, and silicon.

Formation of a (1×1) surface structure could be seen clearly after 5–6 cycles of exposure to Al and then to nitrogen fluxes, as illustrated in FIG. 4(b). This structure corresponds to formation of a continuous layer 28 of AlN, as illustrated in FIG. 1h. From RHEED images the $a_{si(111)}/a_{AlN (0001)}$ ratio of 1.233±0.066 was determined. This compared to 1.235 obtained from standard values of lattice constants of Si and AlN. The image of FIG. 4(b) thus confirms the transformation of AlN islands 26 into a uniform layer 28.

The weak spots appearing in the RHEED pattern of FIG. 4(c) reflect formation of oriented 3D islands of AlN during the initial growth. The transition to 2D growth, with the corresponding streaky pattern shown in FIG. 4(d), occurred after 2–10 min. The transition time depended on the Al flux and the ammonia/Al flux ratio. The fastest transition, corresponding to the AlN thickness of ~7 nm, was observed for the Al flux of $2.0 \times 10^{14}$ at/s cm$^{-2}$ and the ammonia/Al flux ratio equal ~60. The sharp RHEED pattern was maintained through the duration of epitaxial growth.

The samples of AlN were characterized using high resolution X-ray diffraction (XRD) and atomic force microscopy (AFM).

Figure 5:
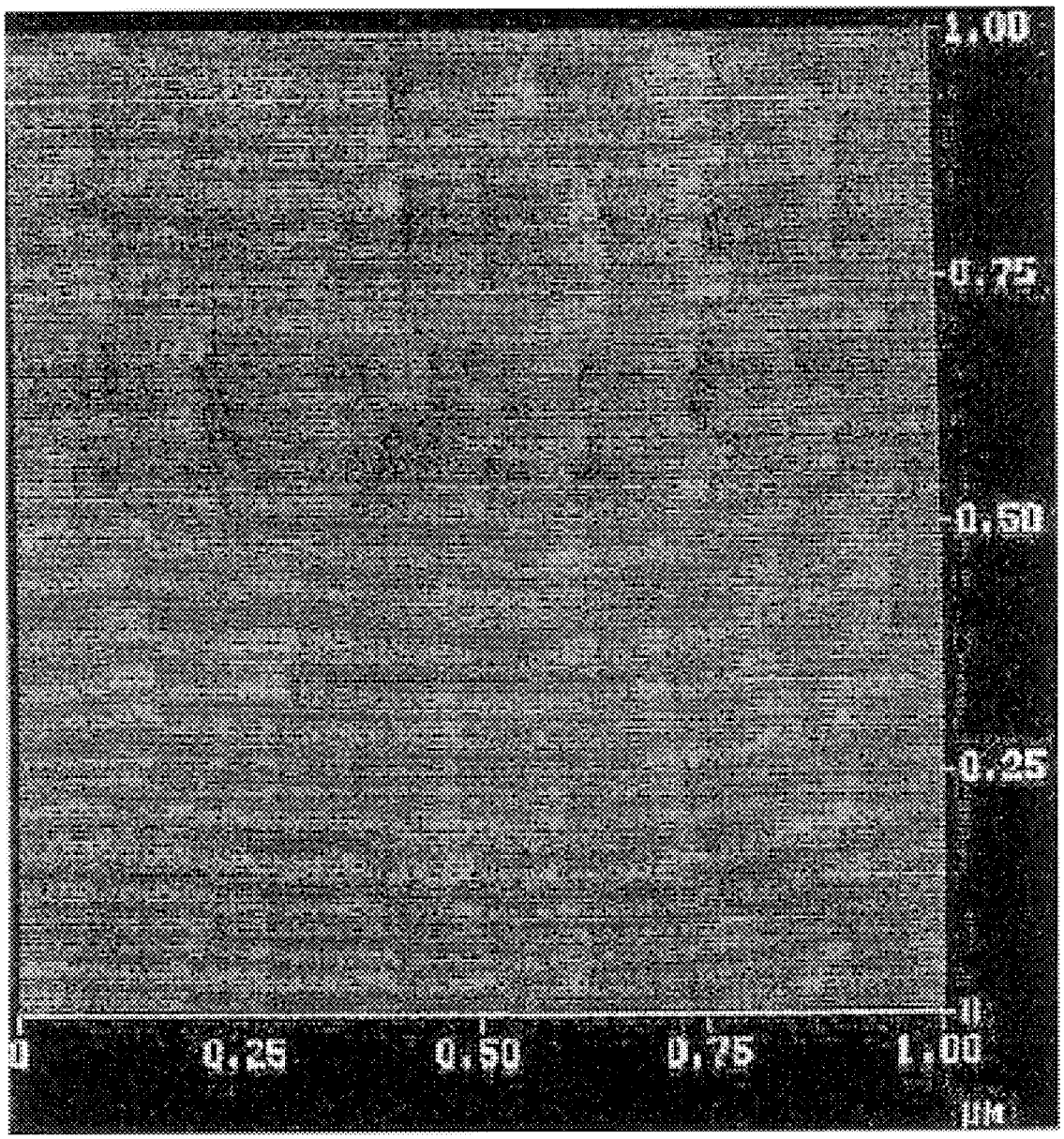
FIG. 5. is an Atomic Force Microscope (AFM) image of AlN grown under optimized conditions on a slightly miscut (~2°) Si(111) wafer.

An AFM image of a 150 nm thick sample of AlN is shown in FIG. 5. The terrace-step morphology characteristic of 2D layer-by-layer growth mode is evident. The layer is very flat, with the surface roughness (rms), calculated from a 1×1 $\mu$m$^2$ scan, of less than 1 nm. Line scans within individual terraces, parallel to the edge, show rms roughness less than 0.3 nm. The terrace widths of about 80–100 nm and the step height of ~3nm, replicate the steps of a substrate with a 2° miscut. These observations are consistent with nucleation of AlN at surface steps of Si and its lateral growth.

Figure 6:
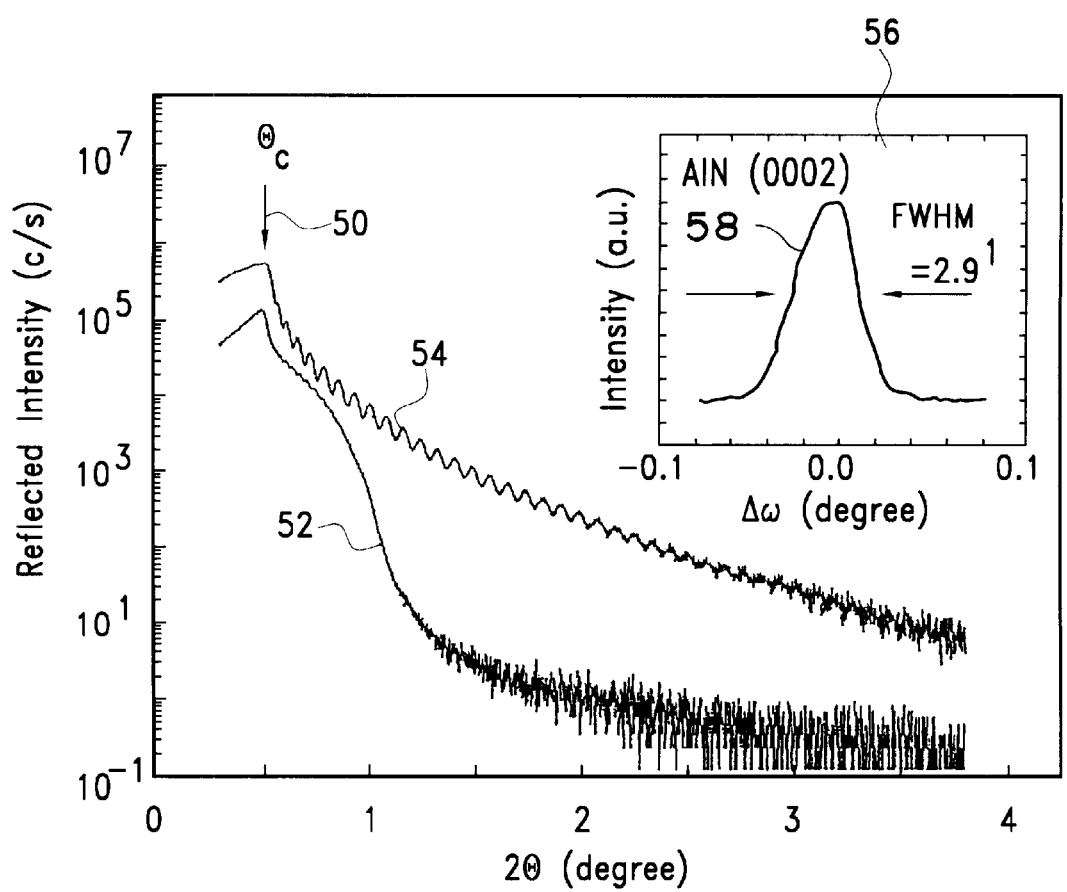
FIG. 6 is a graphical illustration of X-ray reflectivity measured on two AlN/Si(111) samples.

FIG. 6 shows x-ray reflection patterns measured on two AlN samples. The critical angle $\theta_c$ is indicated by an arrow 50. The curves 52 and 54, respectively, correspond to samples grown with the special procedure discussed here and with intentional exposure, for a few tens of seconds, to ammonia. The intentional exposure to ammonia results in formation of amorphous $SiN_x$, something that our procedure was designed to eliminate. The inset 56 shows a $\omega$-2$\theta$ scan of the AlN (0002) reflection for the sample grown without initial nitridation. Reflectivity scans were used to determine the thickness of AlN layers and to evaluate the quality of its interfaces. Reflectivity scans are very sensitive to interface roughness. The surface roughness determines the decay near the critical angle ($\theta_c$) while the interfacial roughness produces a strong damping of oscillations with increasing angle 2$\theta$. The upper curve 52 shows the reflectivity measured on a high quality AlN epitaxial layer with highly uniform interfaces. The roughness extracted from modeling this reflectivity scan, ~0.5 nm, is in excellent agreement with the RHEED and AFM results. The lower curve 54 shows the reflectivity scan obtained from a sample grown on a sample intentionally exposed to the flux of ammonia (20 sec exposure to NH$_3$ with a beam equivalent pressure of $5 \times 10^{-6}$ torr). The sharp drop in intensity near $\theta_c$ and weakly developed interference fringes indicates considerable interface roughness.

The inset 56 of FIG. 6 shows a symmetric $\omega$-2$\theta$ diffraction pattern 58 measured on the sample with high quality interfaces. The full width at half-maximum of the (0002) AlN peak is equal to 2.9'. The coherence length estimated from this width, 120 nm, is in good agreement with the RHEED estimate of the 3D-2D transition thickness and x-ray reflectivity measurements of the entire layer thickness.

Nucleation of high temperature growth on partially nitrided surfaces should be considered very carefully. For example, at a growth temperature of 1160 K the vapor pressure of Al (over Al) is $P°_{Al}$~(1.5–2)×10$^{-5}$ torr. The relationship between the flux and the equivalent pressure is given by the Langmuir equation, $P=\sqrt{2\pi mkT}$, where J is the flux, m is the atomic mass of Al and T is the temperature of the Al source, and k is the Boltzmann constant. Thus, the flux of Al evaporating from the substrate is calculated as $J°_{Al}\approx(0.5-1)\times 10^{14}$ $^n$at/s cm$^2$. The incoming flux of Al in the experiments was $J_{Al}$~(2–2.6)×10$^{14}$ at/s cm$^2$. In practice, these two fluxes are closely balanced, resulting in the deposition of about a monolayer of Al on the Si—N surface 18 and formation of the Si—N—Al islands 26.

It is also interesting to consider surface reactions between Al, N and Si likely to take place in the MBE growth chamber. Such reactions are usually described by standard Gibbs free energies of formation of AlN, GaN and $Si_3N_4$. For a growth temperature T these can be written as $$\Delta G°_{f,T} = \Delta H°_f + \int_{298}^{T} C_P dT - TS° - \int_{298}^{T} \frac{C_P}{T} dT$$

where $\Delta H°_f$ is the standard enthalphy of formation and $S°$ the standard entropy and $C_P$ is the heat capacity. Heat capacities of AlN, GaN, and $Si_3N_4$ can be interpolated as a function of temperature as $C_P(AlN,GaN)=a+bT-cT^{-2}$, and $C_P(Si_3N_4)=a+bT-cT^{-2}+dT^2+eT^3$, and handbook values of fitting constants a to d are used. Gibbs free energies of formation are obtained, per bond and at T=1000–1200 K, of −(0.78–0.80) eV for AlN and −0.65 eV for $Si_3N_4$. Clearly, deposition of Al on a surface containing Si—N bonds results in preferential formation of N—Al bonds. This is in good agreement with the RHEED observations. Gibbs free energy of formation for GaN was also calculated, again per bond, as −0.48 eV. This is lower than the formation energy of Si—N bond. Thus formation of Ga—N bonds on a surface containing Si—N bonds is not feasible.

GaN Experimental Information

Figure 7:
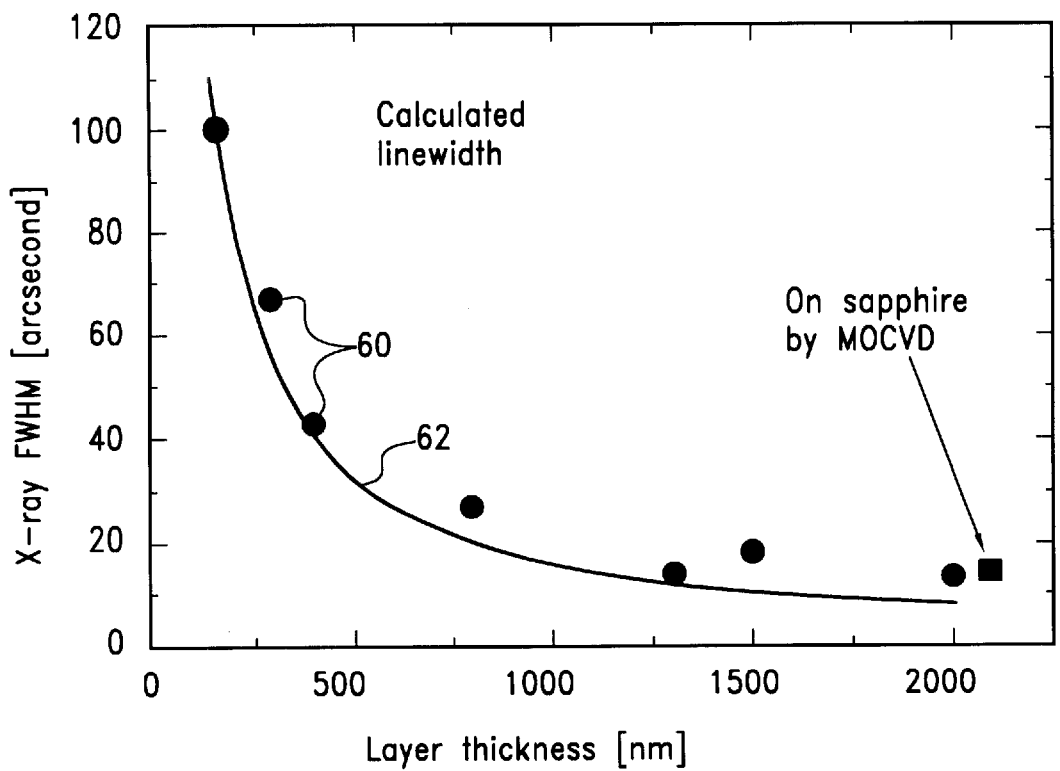
FIG. 7 is a graph illustrating X-ray linewidth (FWHM) in triple-crystal θ–2θ scan, measured for GaN layers as a function of thickness and showing the FWHM calculated for an ideal crystal.

FIG. 7 shows a plot 60 of the x-ray diffraction linewidth, full width at half maximum (FWHM), of the (0002) peak of GaN measured as a function of the layer thickness. In samples 1.5–2 μm thick, the FWHM was as narrow as 14 arc sec. This is narrower than the values reported for GaN grown by MBE on sapphire. FIG. 7 also shows the FWHM curve 62 calculated for ideal crystalline layers as a function of thickness. A comparison of measured and calculated FWHM shows that the disclosed layers are almost completely coherent in the growth direction, for all thicknesses studied.

Figure 8:
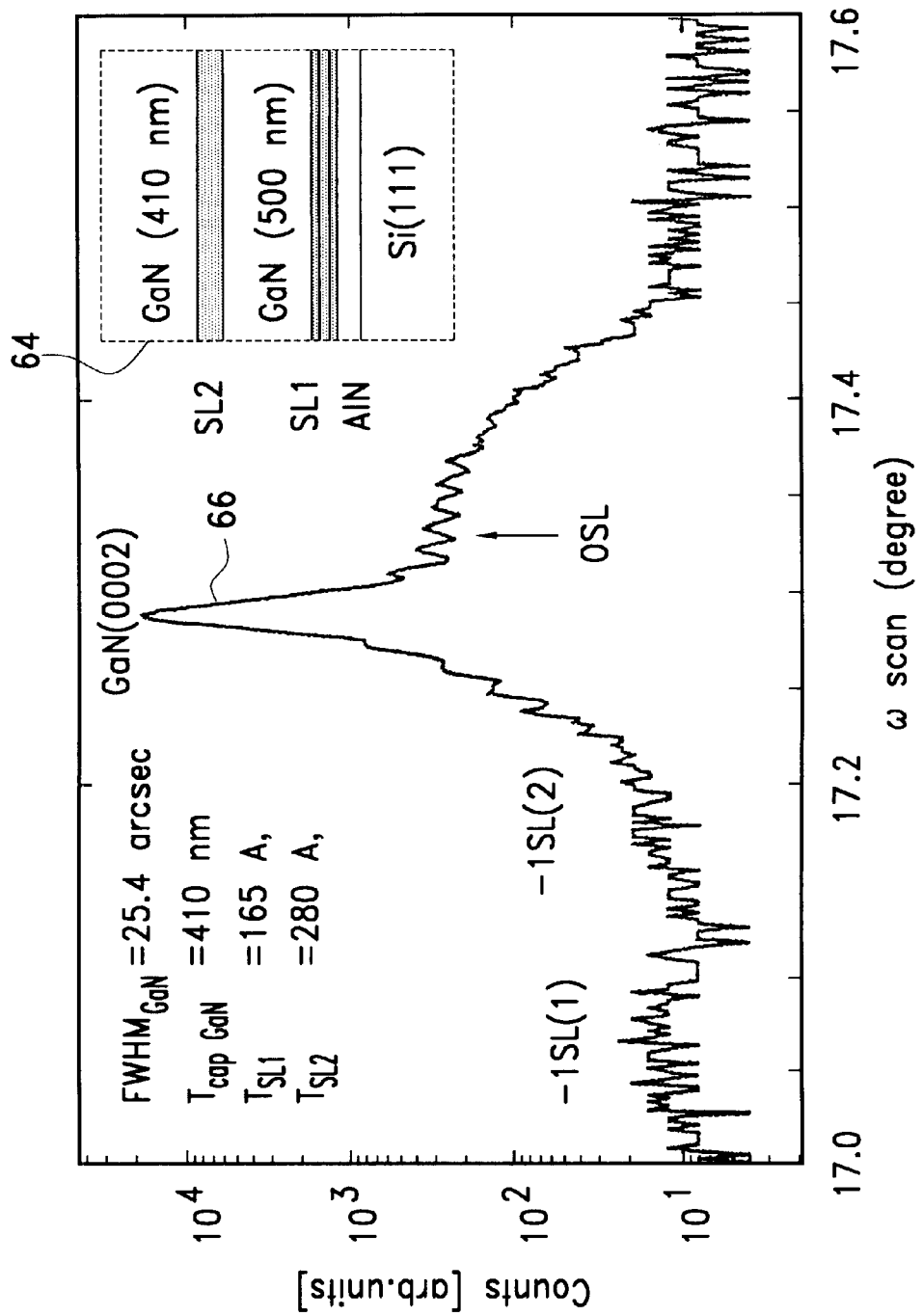
FIG. 8 is a graph illustrating X-ray diffraction data obtained on a GaN sample designed for control of crystalline quality.

FIG. 8 shows X-ray diffraction measurement on a GaN structure 64 incorporating two AlGaN/GaN SLs. The structure 64 is depicted in the inset of FIG. 8, a TEM cross section of the lower part of the structure is shown in FIG. 2b. FIG. 8 shows a narrow (0002) peak of GaN at 66 and the presence of two SLs. The sharpness of the (0002) peak and the presence of Pendellosung fringes, demonstrate high degree of top layer flatness and high crystalline quality. The coherence length calculated from the linewidth was almost equal to the thickness of the top layer of GaN.

Figure 9:
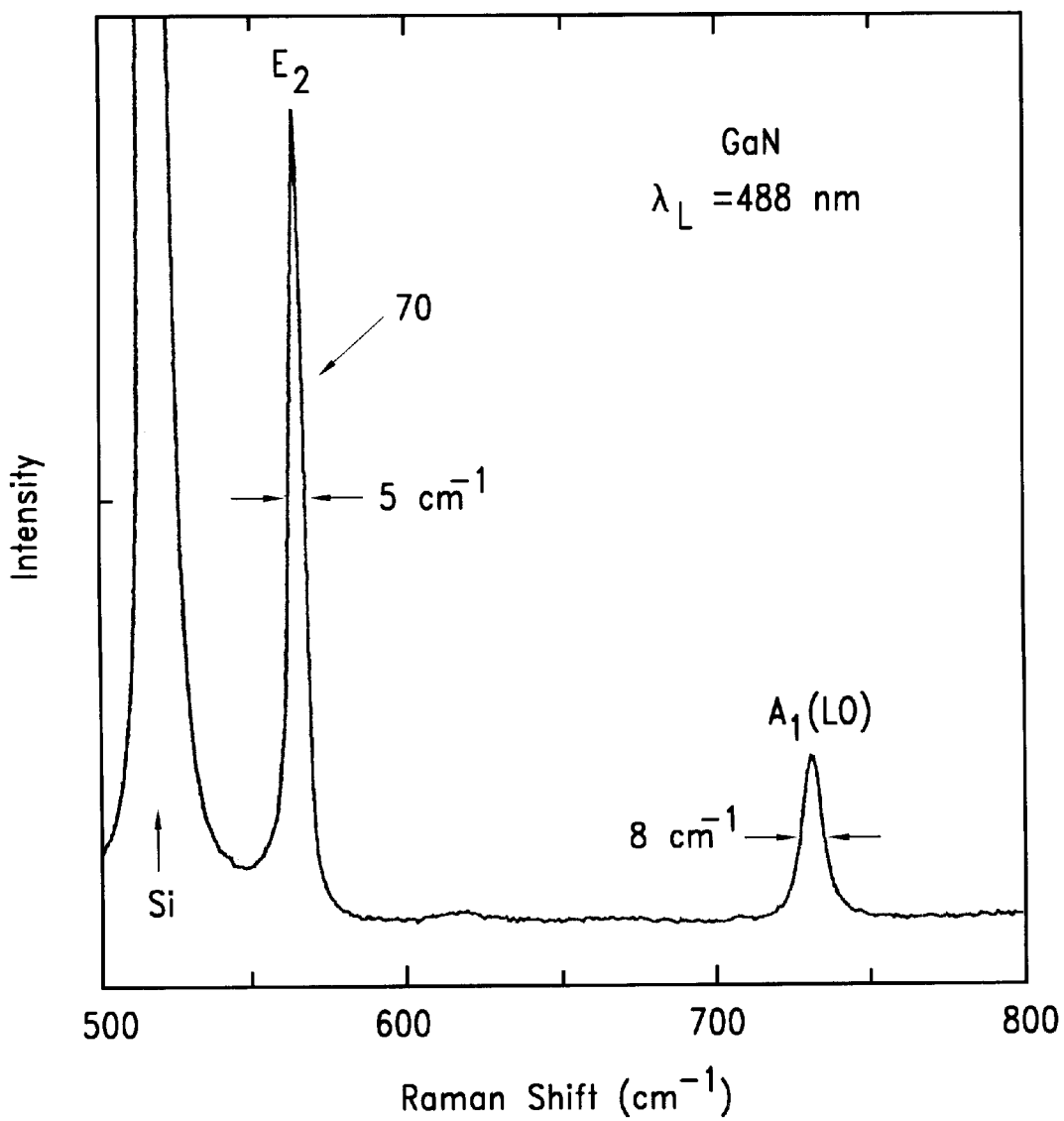
FIG. 9 is a graph illustrating the Raman spectrum of a GaN sample shown in the inset of FIG. 8.

Raman scattering is used to estimate the amount of strain in the layers and to monitor build-up of strain with the layer thickness. Raman measurements were carried out on a structure similar to that illustrated in the inset of FIG. 8, in which the thickness of the top GaN layer was varied between 0.4 to 2.2 μm. All the measurements were done at room temperature using 488 mu excitation from an Ar+laser, in a back-scattering geometry. Under these conditions scattering from the top GaN layer was dominant. FIG. 9 shows a typical Raman spectrum 70, with the dominant $E_2$ phonon near 565 $cm^{-1}$. A weaker Al(LO) band is observed at 733 $cm^{-1}$. This spectrum is characteristic of back-scattering along the wurtzite GaN c=(0001) axis. The relative intensities and FWHM are comparable to Raman spectra of GaN on sapphire. The $E_2$ band intensity is directly proportional to the film thickness and no thickness dependence to the $E_2$ phonon energy was observed. The measured value of 564.8±0.2 $cm^{-1}$ implies a biaxial tensile stress of ~160 MPa and an in-plane strain $e_a$=+0.09%, independent of the sample thickness. This stress is below the ultimate strength of breaking of 400 MPa, under tensile stress, for GaN. Using the difference in thermal expansion coefficients for GaN and Si, the strain due to cooling from growth temperature to ambient can be estimated at $e_a$=+0.06%. The thermal expansion mismatch thus accounts for most of the strain present in the GaN.

Thus, there has been described a preferred form of the present invention. It will be apparent to those of skill in the art that numerous variations and modifications may be made, without departing from the true spirit and scope thereof, as described in the following claims.

What is claimed is:

1. A method for nucleating a nitride layer on a silicon substrate including the steps of:
   a) providing a silicon substrate;
   b) exposing said silicon substrate to a background nitrogen source to produce an ordered Si—N surface phase at a surface of said silicon substrate;
   c) subjecting said silicon substrate surface to a flux of aluminum using MBE to cause aluminum atoms to bond to said ordered Si—N surface phase, thereby producing a plurality of Si—N—Al islands;
   d) subjecting said silicon substrate surface to a flux of nitrogen using MBE to produce an additional ordered Si—N surface phase between said plurality of Si—N—Al islands; and
   e) repeating steps b) and c) until said silicon substrate surface is substantially covered.

2. The method of claim 1, further including the step of cleaning said silicon substrate prior to exposing said silicon substrate to said background nitrogen source.

3. The method of claim 2, wherein the step of cleaning said silicon substrate includes cleaning by chemical etching.

4. The method claim 1, further including the step of growing an AlN layer using MBE on said substantially covered surface.

5. The method of claim 4, wherein the step of growing an AlN layer using MBE on said substantially covered surface includes growing said AlN layer by subjecting said substantially covered surface to a combined flux of aluminum and nitrogen.

6. The method of claim 4, wherein the step of growing an AlN layer includes subjecting said substantially covered surface to a combined flux of aluminum and ammonia.

7. The method of claim 4, wherein the step of growing an AlN layer using MBE on said substantially covered surface occurs at a temperature of 1160±30 K.

8. The method of claim 4, further comprising the step of growing a GaN layer onto said AlN layer using MBE.

9. The method of claim 8, wherein the step of growing a GaN layer onto said AlN layer using MBE includes growing said GaN layer by subjecting said AlN layer to a combined flux of Ga and nitrogen.

10. The method of claim 9, wherein the combined flux of Ga and nitrogen includes a flux of ammonia.

11. The method of claim 8, wherein the step of growing a GaN layer onto said AlN layer using MBE occurs at a temperature of 1000±30 K.

12. The method of claim 8, wherein the step of growing a GaN layer onto said AlN layer using MBE includes growing said GaN layer at a rate of 0.4 to 1.5 μm/hr.

13. The method of claim 1, wherein the step of exposing said silicon substrate to a background ammonia source includes subjecting said silicon substrate to ammonia.

14. The method of claim 1, wherein the step of subjecting said silicon substrate surface to a flux of nitrogen includes subjecting said surface to a flux of ammonia.

15. The method of claim 1, wherein the step of providing a silicon substrate includes providing a Si(111) wafer.

16. The method of claim 1, wherein the step of subjecting said silicon substrate to a flux of aluminum using MBE occurs at a temperature of 1160±30 K.

17. The method of claim 1, wherein the step of subjecting said silicon substrate to a flux of nitrogen using MBE occurs at a temperature of 1160±30 K.

* * * * *